(12) United States Patent
Shimizu et al.

(10) Patent No.: US 7,693,360 B2
(45) Date of Patent: Apr. 6, 2010

(54) OPTOELECTRONIC HYBRID INTEGRATED MODULE AND LIGHT INPUT/OUTPUT APPARATUS HAVING THE SAME AS COMPONENT

(75) Inventors: Takanori Shimizu, Tokyo (JP); Takara Sugimoto, Tokyo (JP); Jun-ichi Sasaki, Tokyo (JP); Kazuhiko Kurata, Tokyo (JP)

(73) Assignee: NEC Corporation, Tokyo (JP)

( * ) Notice: Subject to any disclaimer, the term of this patent is extended or adjusted under 35 U.S.C. 154(b) by 127 days.

(21) Appl. No.: 10/511,630

(22) PCT Filed: Apr. 18, 2003

(86) PCT No.: PCT/JP03/04973

§ 371 (c)(1),
(2), (4) Date: Oct. 19, 2004

(87) PCT Pub. No.: WO04/001861

PCT Pub. Date: Dec. 31, 2003

(65) Prior Publication Data

US 2005/0180679 A1   Aug. 18, 2005

(30) Foreign Application Priority Data

Jun. 24, 2002   (JP) ............................. 2002-183219

(51) Int. Cl.
*G02F 6/12* (2006.01)
*G02B 6/10* (2006.01)

(52) U.S. Cl. ........................ 385/14; 385/129; 257/21; 257/53; 257/54; 257/55; 257/56; 257/72; 257/113; 257/114; 257/115; 257/116; 257/117; 257/118; 257/184; 257/189

(58) Field of Classification Search ................ 385/14, 385/129; 257/21, 53–56, 72, 113–118, 184–189, 257/225–234, 257–258, 290–294, 414, 431–466, 257/499–564
See application file for complete search history.

(56) References Cited

U.S. PATENT DOCUMENTS 5,200,939 A * 4/1993 Nishiwaki et al. ........ 369/44.12

(Continued)

FOREIGN PATENT DOCUMENTS

JP   63-102390   5/1988

(Continued)

OTHER PUBLICATIONS

Japanese Office Action dated Sep. 9, 2004 with Partial English Translation.

*Primary Examiner*—Frank G Font
*Assistant Examiner*—Erin D Chiem
(74) *Attorney, Agent, or Firm*—McGinn IP Law Group, PLLC

(57) ABSTRACT

On the back surface of a transparent plate having a light extracting part for outputting lights to the outside, an electrode for wiring, and an electrode for an electromagnetic shield, an optical device is flip-chip mounted right under the light extracting part, an a driver IC is flip-chip mounted at a desired position with metal bumps. When currents driving the optical device flow from the driver IC according to an electric logical signal from the outside, an optical signal is emitted from the optical device, and is output to the outside through the light extracting part. The light extracting part may be provided with a light coupling material or an optical axis converter.

14 Claims, 4 Drawing Sheets

U.S. PATENT DOCUMENTS

| | | | |
|---|---|---|---|
| 5,249,245 A | 9/1993 | Lebby et al. | |
| 5,416,872 A * | 5/1995 | Sizer et al. | 385/92 |
| 6,343,171 B1 * | 1/2002 | Yoshimura et al. | 385/50 |
| 6,897,430 B2 * | 5/2005 | Uchida | 250/214.1 |
| 2001/0017376 A1 * | 8/2001 | Verdiell | 257/81 |

FOREIGN PATENT DOCUMENTS

| | | |
|---|---|---|
| JP | 63-170141 | 11/1988 |
| JP | 64-50326 | 2/1989 |
| JP | 2-159764 | 6/1990 |
| JP | 2-196476 | 8/1990 |
| JP | 02-291140 | 11/1990 |
| JP | 05-121780 | 5/1993 |
| JP | 6-69490 | 3/1994 |
| JP | 6-54370 | 7/1994 |
| JP | 6-310759 | 11/1994 |
| JP | 06-340118 | 12/1994 |
| JP | 7-178961 | 7/1995 |
| JP | 11-305864 | 11/1999 |
| JP | 2000-49414 | 2/2000 |
| JP | 2000-321096 | 11/2000 |
| JP | 2000-332354 | 11/2000 |
| WO | WO 02/25335 A1 | 3/2002 |

* cited by examiner

OPTOELECTRONIC HYBRID INTEGRATED MODULE AND LIGHT INPUT/OUTPUT APPARATUS HAVING THE SAME AS COMPONENT

TECHNICAL FIELD

The present invention relates to an optoelectronic hybrid integrated module, and in particular, to an optoelectronic hybrid integrated module in which an optical device, a driver IC and the like are mounted.

BACKGROUND ART

In recent years, large-scale switching systems such as large-capacity routers are required corresponding to an increase in the capacity of communication networks. In such a case, limitation of capacity, due to the distance of electrical connections or sizes in the large-capacity connections between cabinets or inside a cabinet, is concerned. This is because higher-speed and higher-density electric signal wiring and delays in electric wiring stand as bottlenecks in realizing higher performance, although operating speed and integration scale have been improved along with the developments in the IC and LSI techniques. As a technique to solve this problem, an optical interconnection is drawing the attention. As a configuration of a small and low-cost signal input/output device using optical interconnection, it is effective that the signal processing is performed by a logic LSI and interfacing with the outside is performed by an optoelectronic hybrid integrated module.

This type of optoelectronic hybrid integrated module has been so configured as to combine a base material, on which an optical device and a driver IC are mounted, and a case to which a light extracting part such as a lens is provided. FIG. 9 shows a schematic side sectional view of a conventional optoelectronic hybrid integrated module.

As shown in FIG. 9, on a wiring substrate 98 in which interlayer wiring 96 and wiring patterns are formed on the top and the back surfaces, an optical device 91 for transmitting or receiving optical signals is fixed with a solder, and the optical device 91 and the wiring of the wiring substrate 98 are connected by a metal wire 97, and a driver IC 92 (an electric amplifier IC in the case of receiver) for adjusting the current amplitude of the optical device 91 is fixed in the same way and is electrically connected. Further, on a case 93 made of a material such as covar or the like, a light coupling means 94 such as a planar microlens is mounted. Then, by mounting the case 93 on the wiring substrate 98, light coupling between the optical device 91 and the outside is realized through the light coupling means 94.

In the conventional optoelectronic hybrid integrated module, however, the wiring substrate and the case, on which each component is mounted separately, are used. For example, the optical device is fixed and connected to the wiring substrate with a solder or by wire bonding, the driver IC is fixed and connected to the wiring substrate by soldering, and the lens is fixed to the case with an adhesive or the like. Then, finally they are assembled as a whole. This causes a problem of an increase in the number of components and processes, and an increase in the mounting cost.

Further, in drawing out the wiring, a wider margin of the wiring is required for wire-bonding the optical device, which causes a problem that high-density mounting of the components becomes difficult.

Further, in order to carry out electromagnetic shielding effectively, the case is preferably made of metal such as covar, which causes a problem of an increase in the cost.

Further, in extracting or taking in lights, since the lens and the optical device are mounted separately, dispersion of the distance between the lens and the optical device or their positions becomes large, which causes a problem of dispersion of the optical outputs themselves.

Further, when sealing is considered, since the module is divided into the case and the wiring substrate, it is required to inject a sealing material into the hollow portion of the divided package consisting of the two parts. Moreover, since the lens is fixed with an adhesive, hermetic sealing is also difficult.

DISCLOSURE OF THE INVENTION

It is an object of the present invention to provide an optoelectronic hybrid integrated module in which the number of components and the processes are reduced, so that the mounting cost is suppressed. It is another object of the present invention to provide an optoelectronic hybrid integrated module in which a narrow margin of wiring is acceptable and the mounted components can be arranged in high density. Further, it is another object of the present invention to provide an optoelectronic hybrid integrated module having a plate with which an electromagnetic shield can be realized at low cost. Further, it is another object of the present invention to provide an optoelectronic hybrid integrated module in which dispersion of distance between a lens and an optical device is suppressed, so that dispersion in the optical output is small. Further, it is another object of the present invention to provide an optoelectronic hybrid integrated module in which sealing can be done relatively easily.

In order to achieve the aforementioned objects, an optoelectronic hybrid integrated module according to the present invention comprises: an optical device for converting optical signals into electric signals and vice versa; an input/output IC for drive-controlling the optical device; and a transparent base material having electric wiring and light permeability. The module is so configured that the optical device and the input/output IC are flip-chip mounted on the transparent base material, and light inputting/outputting between the optical device and the outside is carried out due to the light permeability of the transparent base material.

According to the present invention, the optical device which converts light signals into electric signals and vice versa, and the input/output IC for drive-controlling the optical device are flip-chip mounted on the transparent base material having electric wiring and light permeability. Further, light inputting/outputting between the optical device and the outside is carried out due to the light permeability of the transparent base material.

Therefore, the number of components and processes can be reduced, so that the mounting cost can be suppressed. Further, a narrow margin of wiring is acceptable, whereby the mounted components can be arranged in high density.

Further, the electric wiring of the transparent base material can electrically connect the optical device and the input/output IC and also serve as an electromagnetic shield for the optical device and the input/output IC.

Further, the optical device is configured as a light emitting device which converts electric signals into optical signals and outputs them, and the input/output IC is configured as a driver IC which outputs electric signals to the optical device. Alternatively, the optical device may be configured as a light receiving device which converts optical signals into electric signals, and the input/output IC may be configured as an electric amplifier IC which amplifies electric signals from the light receiving device.

Further, the transparent base material is formed of a transparent plate which transmits lights, the transparent plate being made of a material having high permeability to the wavelength of the optical device. Alternatively, the transparent base material may be formed of a flexible sheet which transmits lights, the flexible sheet being made of a material having high permeability to the wavelength of the optical device.

It is desirable that the transparent base material include a light coupling means for improving light coupling efficiency provided at a position facing the optical device. In this case, the light coupling means may be integrally formed with the transparent base material. Further, the transparent base material may include an optical axis converter which converts the direction of the optical axis with reference to the light coupling means.

Further, the optical device and the input/output IC have an interposer as a holder and a heat spreader. Alternatively, it is desirable that the transparent base material be fixed to a holding frame within which electric wiring is incorporated.

Further, it is possible to configure a light input/output apparatus using an optoelectronic hybrid integrated module of the present invention. More specifically, a light input/output apparatus according to the present invention comprises an optoelectronic hybrid integrated module and a logic LSI. The optoelectronic module includes: an optical device for converting optical signals into electric signals and vice versa; an input/output IC for drive-controlling the optical device; and a transparent base material having electric wiring and light permeability. The apparatus is so configured that the optical device and the input/output IC are flip-chip mounted on the transparent base material, and that light inputting/outputting between the optical device and the outside is carried out due to the light permeability of the transparent base material. Further, the apparatus is so configured that the logic LSI controls electric signals input into or output from the optoelectronic hybrid integrated module, and the optoelectronic hybrid integrated module and the logic LSI are mounted on the same substrate.

As described above, the present invention has such a configuration that an optical device and an input/output IC are flip-chip mounted on a transparent base material, and by utilizing the light permeability of the transparent base material, light inputting/outputting to/from the optical device is carried out. Thereby, the number of components and processes can be reduced, so that the mounting cost is suppressed. Further, a narrow margin of wiring is acceptable, whereby the mounted components can be arranged in high density. Moreover, a low-cost plate, in which an electromagnetic shield is taken into account, can be realized, dispersions in light outputs can be suppressed, and sealing can be done relatively easily.

BEST MODE FOR CARRYING OUT THE INVENTION

Figure 1:
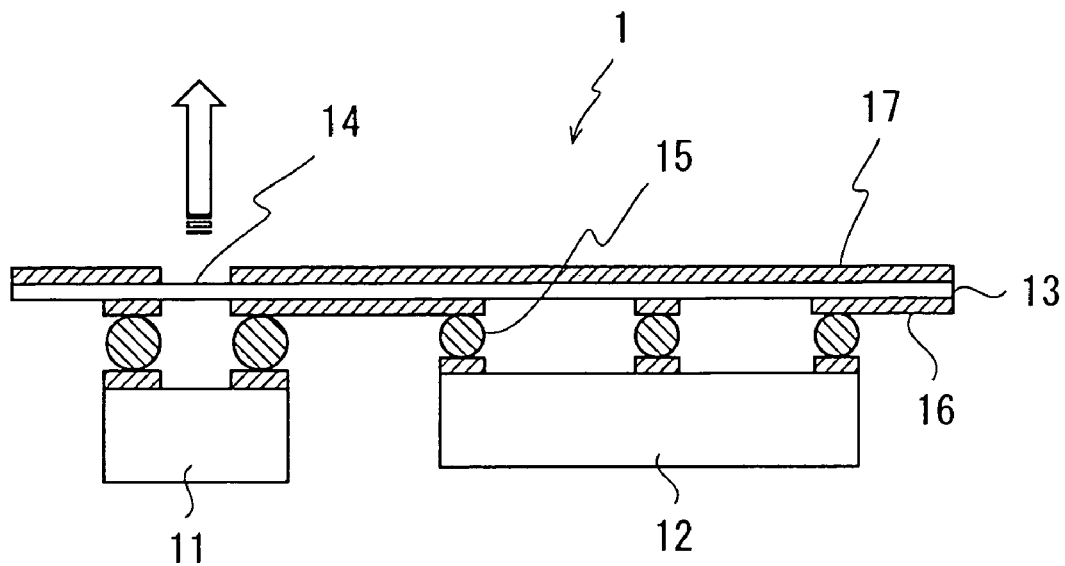
FIG. 1 is a schematic side sectional view showing the configuration of an optoelectronic hybrid integrated module according to a first embodiment of the present invention.

Next, embodiments of the present invention will be described with reference to the drawings. FIG. 1 is a schematic side sectional view showing the configuration of an optoelectronic hybrid integrated module of a first embodiment of the present invention.

The optoelectronic hybrid integrated module according to the embodiment shown in FIG. 1 uses a transparent plate 13 having a light extracting part 14 for inputting/outputting lights between the outside and an optical device 11, and electrodes 16, 17 wired on the top and the back surfaces. On the back surface of the transparent plate, the optical device 11 is flip-chip mounted with metal bumps so as to be positioned right under the light extracting part 14, and a driver IC is flip-chip mounted with metal bumps so as to be positioned near the optical device 11. Here, the transparent plate 13 is used as a transparent base material. Although the light extracting part 14 constitute a light coupling means for improving the light coupling efficient of the transparent plate facing to the optical device, the light coupling means is not limited to the configuration of the optical extracting part 14.

The optical device 11 consists of a light emitting device which converts electric signals into optical signals and outputs them, or a light receiving device which converts optical signals made incident into electric signals. The optical device 11 may be formed of the light emitting devices or the light receiving devices in the form of plural arrays.

The driver IC 12 constitutes an input/output IC which outputs electric signals to the light emitting device (optical device) 11. The driver IC 12 is so configured as to output electric signals controlled to the current amplitude required for driving the light emitting device (optical device) 11, to the light emitting device, corresponding to the modulating signals of the specified voltage. In the case of the optical device 11 being a light receiving device, the input/output IC is so configured as an electric amplifier IC which electrically amplifying electric signals output from the light receiving device (optical device) 11, and the electric amplifier IC is used instead of the driver IC 12 shown in the Figure. Further, a light receiving device is used as the optical device 11, instead of the light emitting device. As for the electric amplifier IC, a trans-impedance amplifier, a limiting amplifier or the like is used.

The optoelectronic hybrid integrated module of the present invention includes two modules, one of which includes a light emitting device as described above so as to make lights from the optical device to be emitted from the plate side, and the other includes a light receiving device so as to make lights from the outside of the plate incident to the optical device. However, the basic configurations are same, and only the optical device and the function of the input/output IC corresponding to the device are different. Therefore, a mode including a light emitting device and a driver IC is exemplary explained, which is also applied to embodiments described hereinafter with reference to the drawings. However, the present invention is not limited to this mode. Another mode in which the light emitting device is substituted with a light receiving device, and the driver IC is substituted with an electric amplifier IC is also included in the scope of the present invention.

The transparent plate 13 is desirably made of a material such as glass or silicon series having high permeability to the wavelength of the optical device 11. The top surface of the light extracting part 14 may be a flat surface if the beam divergence of the optical device 11 is small. Further, the electrodes 16 and 17 disposed on the top and the back surfaces of the transparent plate 13 are formed by using the lithographic technique, after the electrode material is deposited on the respective surfaces. The electrode 16 on the back surface is formed to electrically connect the optical device 11 and the driver IC 12, and the driver IC 12 and the outside, and to perform high-precision positioning of the optical device 11 and the driver IC 12 by flip-chip mounting using the metal bumps 15.

In this way, since the connection is realized with the flip-chip mounting, space for connection required in the conventional wire bonding is not needed, which enables high density mounting. On the other hand, the electrode 17 on the top surface is formed to take a part of the role of an electromagnetic shield as a ground electrode. This enables the shield configuration to be realized without using an expensive metal package as conventional examples. Further, when resin sealing is performed, only the area around the device mounted on the back surface of the transparent plate 13 should be sealed. By selecting appropriate resin material and performing resin sealing between the transparent plate 13 and the optical device 11 without air gap, sealing which never takes in unintentional reflection or scattering can be realized. Thereby, a step of injecting resin into the whole hollow part, which is required in conventional divided packages, is not needed any more.

Next, the operation of the optoelectronic hybrid integrated module 1, in the case of the optical device 11 being a light emitting device, will be described. An electric logical signal of the prescribed voltage is supplied from the outside to the driver IC 12, and at the same time, power supply voltage is provided to the driver IC 12 through the electrode 16 on the transparent plate 13. From the driver IC 12, a current corresponding to the outside electric signal and having an amplitude required for driving the optical device 11 (in this case, light emitting device) is input into the optical device 11. Corresponding to the input current, an optical signal is emitted from the optical device 11, and is output to the outside through the light extracting part 14.

In the case of the optical device 11 being a light receiving device, the optical device receives an optical signal made incident from the outside through the light extracting part 14, and a current generated by the light receiving device is converted into voltage and is output to the outside with the prescribed voltage, by an electric amplifier IC provided instead of the driver IC 12.

Figure 2:
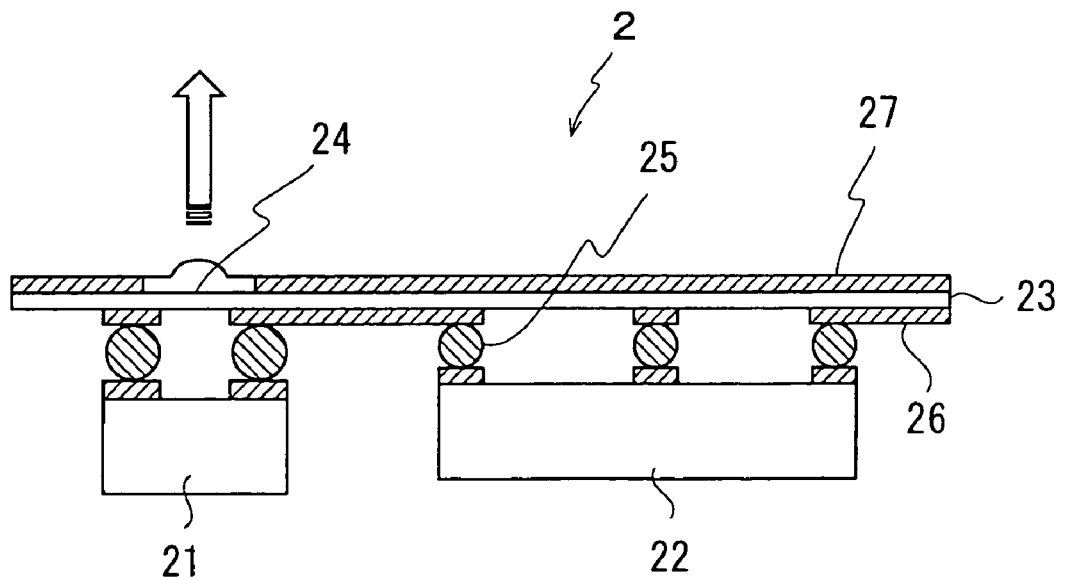
FIG. 2 is a schematic side sectional view showing the configuration of an optoelectronic hybrid integrated module according to a second embodiment in which an optical extracting part according to the present invention includes a light coupling means such as a potting lens.

Next, a second embodiment according to the present invention will be described with reference to the drawings. FIG. 2 is a schematic side sectional view showing the configuration of an optoelectronic hybrid integrated module according to the second embodiment in which the light extracting part of the present invention includes a light coupling material such as a potting lens.

A transparent plate 23 itself is formed of flat surfaces, and a light coupling material 24, which is a light coupling means, is formed by bonding a convex potting lens or microlens to the transparent plate 23. Taking into account the thermal history in the mounting step, it is desirable that the light coupling material 24 has a coefficient of thermal expansion (CTE) close to that of the transparent plate 23. Further, since reflection is suppressed by the bonded surface between the transparent plate 23 and the lens, it is desirable that the refractive index of the lens be similar to that of the transparent plate 23. Thereby, condensing can be performed effectively even if the beam divergence is large. The configuration except the light coupling material 24 being provided, more specifically, an optical device 21, a driver IC 22, a transparent plate 23, electrodes 26 and 27, and metal bumps 25 are same as that of the first embodiment, and the operations thereof are also same as that of the first embodiment, therefore the explanations are omitted.

Figure 3:
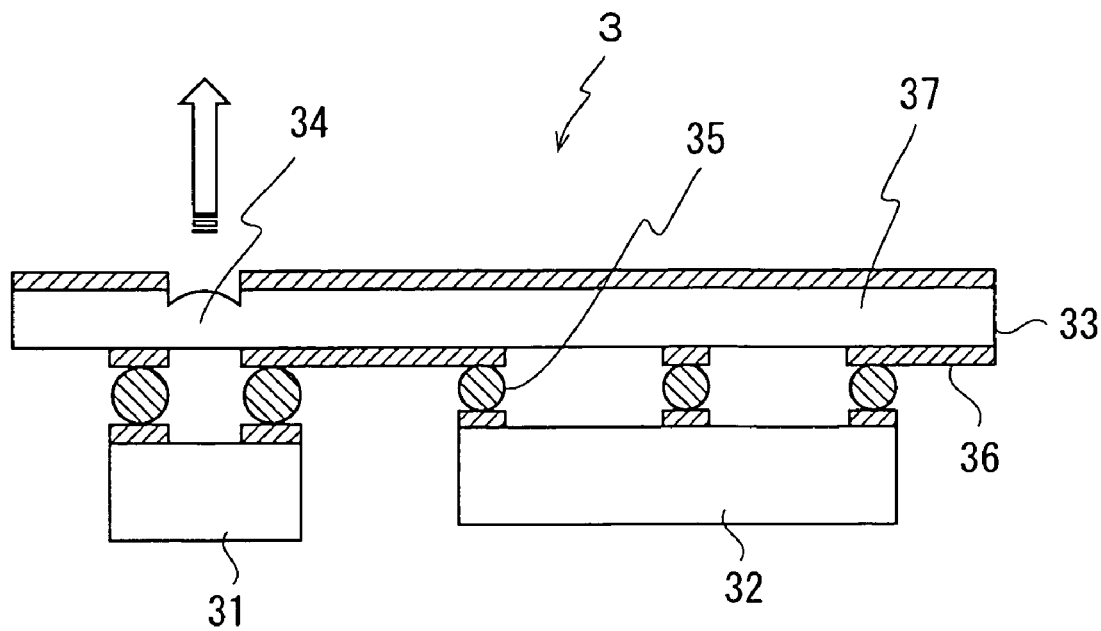
FIG. 3 is a schematic side sectional view showing the configuration of an optoelectronic hybrid integrated module according to a third embodiment in which the optical extracting part of the present invention has been provided with a coupling means formed on a transparent plate beforehand.

Next, a third embodiment according to the present invention will be described with reference to the drawings. FIG. 3 is a schematic side sectional view showing the configuration of an optoelectronic hybrid integrated module according to the third embodiment in which the light extracting part of the present invention includes a coupling unit which has been formed in the transparent plate beforehand.

A transparent plate 33 is made of an Si substrate, polymer, glass or the like, and a light coupling unit 34 is a lens formed in the transparent plate 33 itself by etching or machining. In the case of this transparent plate 33, the light coupling unit 34, that is, a light coupling means, is integrally formed, whereby misalignment of the optical axis of the light coupling means can be reduced substantially comparing with that of the second embodiment. The configuration except the light coupling unit 24 being provided, more specifically, an optical device 31, a driver IC 32, a transparent plate 33, electrodes 36 and 37, and metal bumps 35 are same as that of the first embodiment, and the operations thereof are also same as that of the first embodiment, therefore the explanations are omitted.

Figure 4:
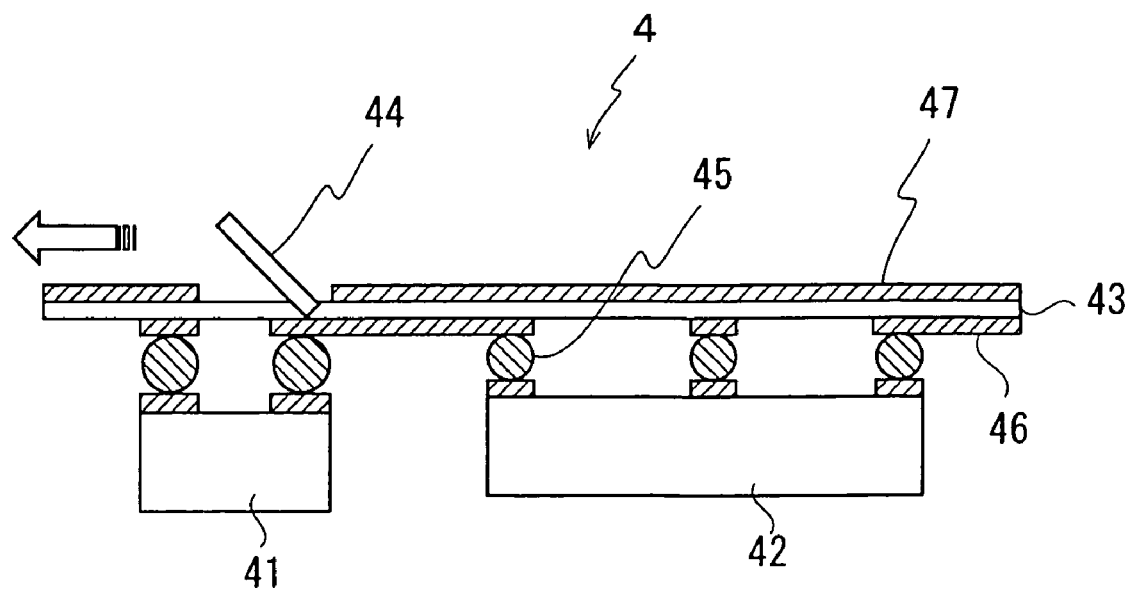
FIG. 4 is a schematic side sectional view showing the configuration of an optoelectronic hybrid integrated module according a forth embodiment having such a configuration that an optical axis converter is provided to the optical extracting part of the present invention.

Next, a fourth embodiment according to the present invention will be described with reference to the drawings. FIG. 4 is a schematic side sectional view showing the configuration of an optoelectronic hybrid integrated module according to the fourth embodiment having such a configuration that an optical axis converter is provided at the light extracting part of the present invention.

The optical axis converter 44, which may be formed by mounting a micro mirror or the like on a transparent plate 43 or by processing the transparent plate 43 itself so as to be a metal mirror, is capable of converting the optical axis by, for example, 90 degrees from the vertical direction to the horizontal direction, as shown in FIG. 4. Further, if the beam divergence of an optical device 41 causes a problem, the mirror part can be formed to be a concave mirror so as to have a condensing function.

The configuration except the optical axis converter 44 being provided, more specifically, an optical device 41, a driver IC 42, a transparent plate 43, electrodes 46 and 47, and metal bumps 45 are same as that of the first embodiment, and the operations thereof are also same as that of the first embodiment, therefore the explanations are omitted.

Figure 5:
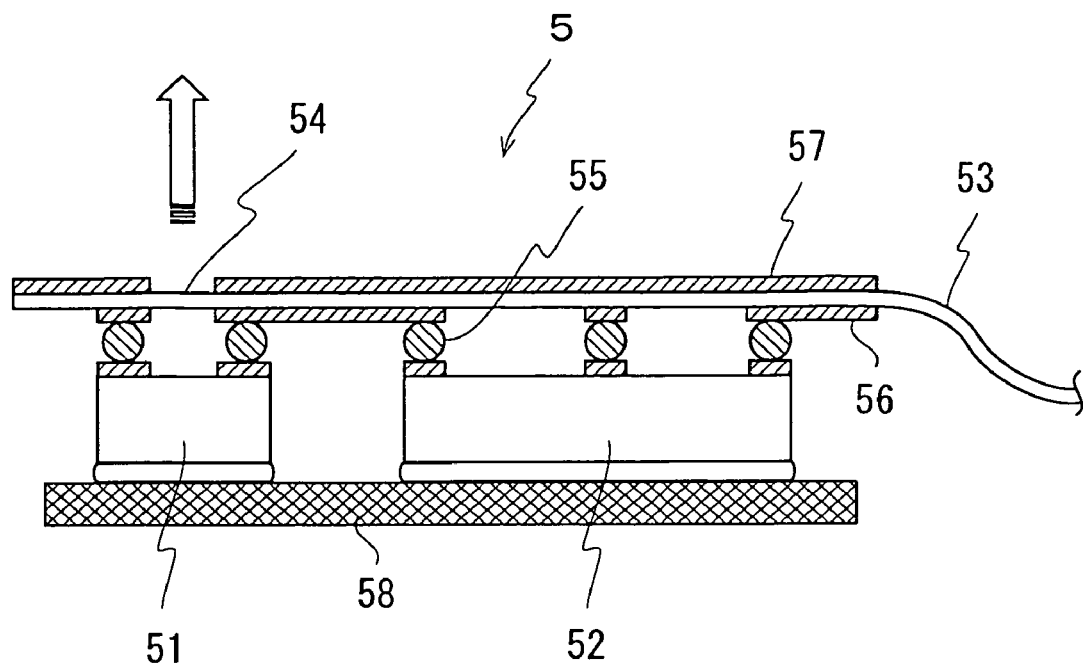
FIG. 5 is a schematic side sectional view showing the configuration of an optoelectronic hybrid integrated module according to a fifth embodiment in which a transparent base material consists of a flexible sheet.

Next, a fifth embodiment according to the present invention will be described with reference to the drawings. FIG. 5 is a schematic side sectional view showing the configuration of an optoelectronic hybrid integrated module according to the fifth embodiment in which the transparent base material of the present invention consists of a flexible sheet. The configurations of a light extracting part 54, an optical device 51 and a driver IC 52 are same as those of the first to the fourth embodiments.

The present embodiment has a characteristic that inputs of electric signals from the outside (or outputs of electric signals to the outside) are carried out through a flexible sheet 53, which is the transparent base material. Although the configuration corresponding to the first embodiment is shown here, the present embodiment may have such a configuration that a light coupling material is provided to a light extracting part 54 as the second to the forth embodiments, that a light coupling material is provided or formed, or that an optical axis converter is provided or formed.

Further, by keeping the heights of the optical device 51 and the driver IC 52 to the same level, an interposer 58 as a holder and a heat spreader for the optical device 51 and the driver IC 52, can be arranged in the lower part, which improves heat discharging and holding functions. Although the state of the interposer 58 being provided is shown here, it may not be provided.

The interposer may be provided to an optoelectronic hybrid integrated module having a transparent plate as a transparent base material described in the first to the fourth embodiments. The configurations and the operations are same as that of the first embodiment except that the transparent base material consists of a flexible sheet and an interposer having heat dissipating and holding functions is provided, therefore the explanations are omitted.

Figure 6:
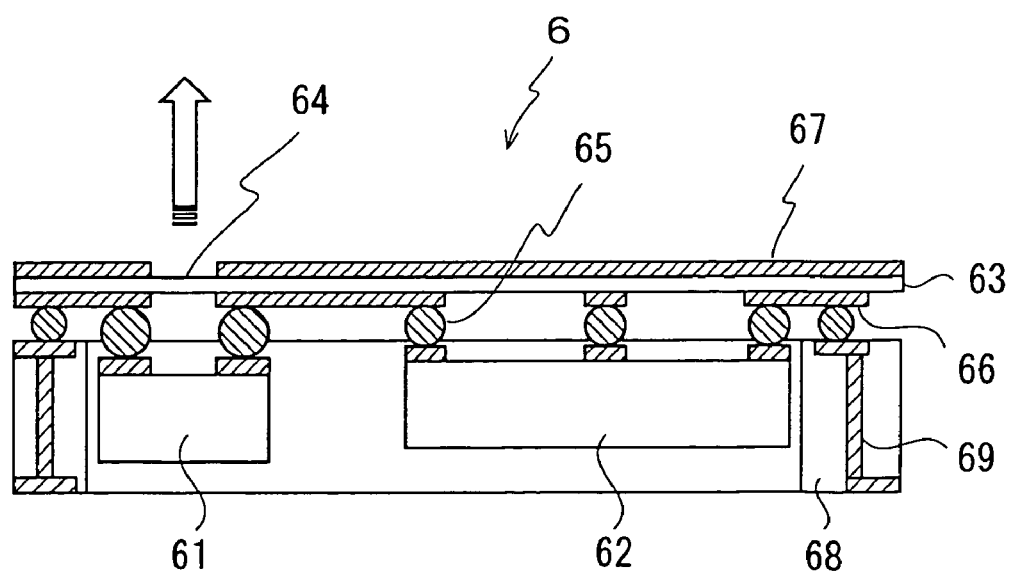
FIG. 6 is a schematic side sectional view showing the configuration of an optoelectronic hybrid integrated module of a sixth embodiment in which a transparent plate of the present invention is fixed to a holding frame.

Next, a sixth embodiment according to the present invention will be described with reference to the drawings. FIG. 6 is a schematic side sectional view showing the configuration of an optoelectronic hybrid integrated module according to the sixth embodiment in which the transparent plate of the present invention is fixed to a holding frame.

Around the lower side of the transparent plate 63, a holding frame 68 having interlayer wiring 69 in mounted, surrounding an optical device 61 and a driver IC 62. However, light extracting is same as that of the first to the fourth embodiments, like the fifth embodiment.

The present invention has a characteristic that inputting/outputting of electricity is carried out by the interlayer wiring 69 incorporated in the holding frame 68, which enables electrical connections from the lower side. Further, the interlayer wiring 69 may incorporate passive components and be embedded in the holding frame 62. Fixing of the holding frame 62 and the transparent plate 63 can be achieved solely with electrical connections, without adjusting the optical axis like conventional art. Although an example of the transparent base material being the transparent plate 63 is described here, a holding frame can be provided in the same way to an optoelectronic hybrid integrated module in which the transparent base material is a flexible sheet. Further, a configuration combining an interposer and a holding frame is also acceptable.

An optical device 61, a driver IC 62, a transparent plate 63, a light extracting part 64, electrodes 66 and 67, and metal bumps 65 are same as those of the first embodiment, and the operations are also same as those of the first embodiment, therefore the explanations are omitted.

Figure 7:
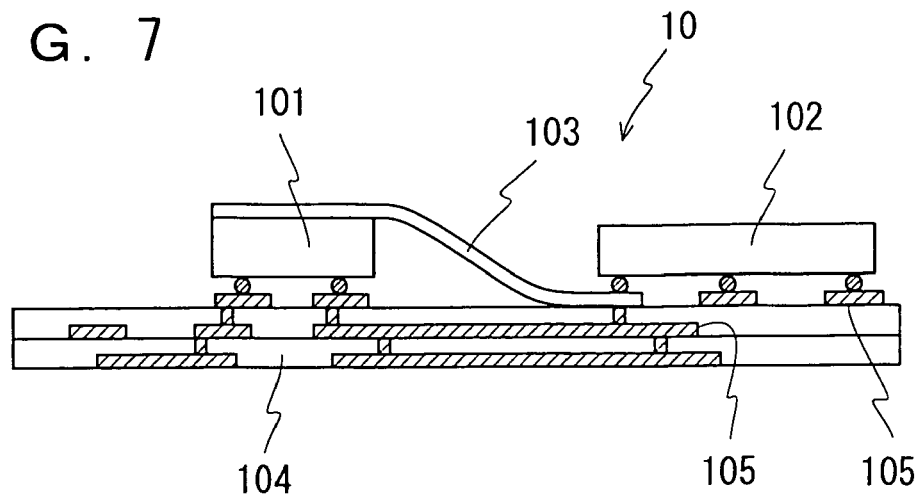
FIG. 7 is a schematic side sectional view showing the configuration of a light input/output apparatus according to a first embodiment consisting of an optoelectronic hybrid integrated module and a logic LSI.

Next, a first embodiment of a light input/output apparatus, which is a signal processing module using the optoelectronic hybrid integrated module of the present invention, will be described with reference to the drawings. FIG. 7 is a schematic side sectional view showing the configuration of a light input/output apparatus of the first embodiment formed of an optoelectronic hybrid integrated module and a logic LSI.

A light input/output apparatus 10 of the first embodiment shown in FIG. 7 includes: an optoelectronic hybrid integrated module 101 of the present invention, and a logic LSI 102 for controlling electric signals being input into or output from the module, which are mounted on a substrate 104 in which electrodes 105 are arranged between layers and on the surface.

The optoelectronic hybrid integrated module 101 shown in FIG. 7 has the configuration of the optoelectronic hybrid integrated module 5 according to the aforementioned fifth embodiment, and the optoelectronic hybrid integrated module 101 and the logic LSI 102 are electrically connected with each other by a flexible sheet 103 so as to exchange electric signals.

The voltage signal level of inputs/outputs of the optoelectronic hybrid integrated module 101 is defined by the driver IC incorporated in the optoelectronic hybrid integrated module 101, whereby the logic LSI 102 can be designed similar to the general LSIs. Although a case of one optoelectronic hybrid integrated module 101 being provided is shown in FIG. 7, plural modules may be provided. Further, an electrical connection from the logic LSI 102 to each module may be performed separately with each flexible sheet 103.

Although the optoelectronic hybrid integrated module 5 of the fifth embodiment using a flexible sheet has been described as the optoelectronic hybrid integrated module 101, optoelectronic hybrid integrated modules according to the first to the fourth and the sixth embodiments may be used, and the connection between optoelectronic hybrid integrated modules and the logic LSI may be performed with a metal wire or electrodes in the substrate 104.

Figure 8:
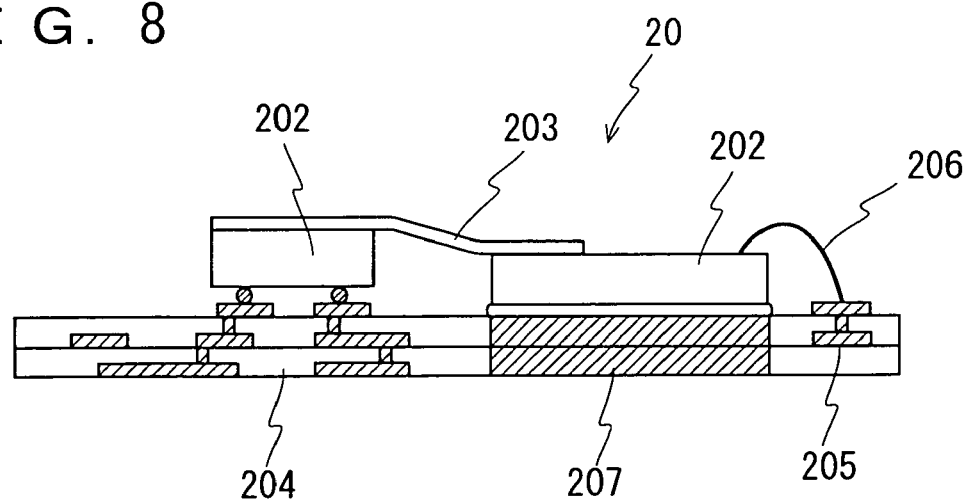
FIG. 8 is a schematic side sectional view showing the configuration of a light input/output apparatus according to a second embodiment where heating of the logic LSI is discharged from the base material side.
Figure 9:
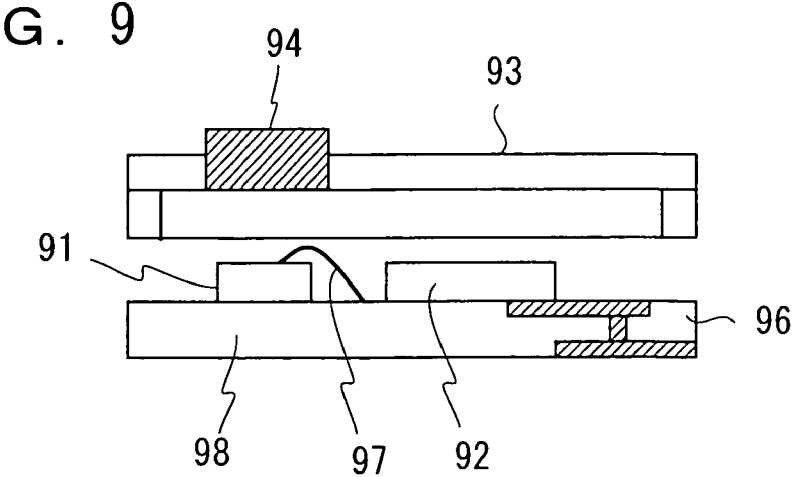
FIG. 9 is a schematic diagram showing the configuration of a conventional optoelectronic hybrid integrated module.

Next, a second embodiment according to a light input/output apparatus which is a signal processing module using an optoelectronic hybrid integrated module of the present invention will be described with reference to the drawings. FIG. 8 is a schematic side sectional view showing the configuration of a light input/output apparatus according to the second embodiment in which heating of a logic LSI is discharged from the substrate side.

A light input/output apparatus 20 according to the second embodiment includes a discharging means such as thermal metal vias or the like under the logic LSI 202 in the substrate 204, whereby heating can be discharged from the substrate side.

The electrical connection between the optoelectronic hybrid integrated module 201 and the logic LSI 202 is carried out with a flexible sheet 203 constituting the optoelectronic hybrid integrated module 201. Further, electrical connection between the logic LSI 202 and an electrode 205 in the substrate 204 is carried out by a metal wire 206. In the embodiment, optoelectronic hybrid integrated modules according to the first to the forth and the sixth embodiments using transparent plates may be used, and connection between the optoelectronic hybrid integrated module and the logic LSI may be carried out with a metal wire or an electrode in the substrate 204.

EXAMPLE

A specific example of the optoelectronic hybrid integrated module 1 shown in FIG. 1 will be described. The optical device 11 was a vertical cavity surface emitting laser (VCSEL) with an oscillation wavelength of 850 nm, and was flip-chip mounted on the transparent plate using AuSn solder as the metal bumps 15. As the transparent plate 13, one having high light permeability to the oscillation wavelength of 850 nm of the optical device 11 was selected. The driver IC 12 controlled input currents to the optical device 11 according to electric signals of 3.125 Gb/s differentially input from the outside. The amplitude of currents supplied to the optical device 11 was about several mA, and the maximum output was −1 dBm. Since the optical device 11 and the light extracting part 14 were flip-chip mounted, the coupling effect was −3±0.3 dB.

INDUSTRIAL AVAILABILITY

As described above, the following effects have been achieved with the optoelectronic hybrid integrated module according to the present invention.

1) The number of components and processes can be reduced, so that the mounting cost can be suppressed. This is due to the configuration in which an optical device and a driver IC or an electric amplifier IC are flip-chip mounted on a transparent base material having wiring and a light extracting function.

2) The narrow margin of the wiring is acceptable, whereby the mounted component can be arranged in high density, due to the optical device and the driver IC being flip-chip mounted.

3) An electromagnetic shield can be realized at low cost, due to a ground electrode being formed on the transparent base material, which also serves as an electromagnetic shield.

4) Dispersion of distance between the lens and optical device can be suppressed, whereby dispersion in the light output can be reduced, due to an optical device being flip-chip mounted on the transparent base material having a light extracting function.

5) Only a gap between each device and the transparent base material is to be sealed, which can be done relatively easily. This is due to the fact the optical device and the driver IC are mounted collectively on the transparent base material.

What is claimed is:

1. An optoelectronic hybrid integrated module comprising:
    an optical device for converting one of an optical signal into an electric signal and an electrical signal into an optical signal;
    an input/output IC for drive-controlling the optical device; and
    a transparent base material having electric wiring and light permeability, the transparent base material including a light coupling means at a position substantially facing the optical device,
    wherein the optical device and the input/output IC are flip-chip mounted on a surface of the transparent base material substantially aligned with the light coupling means, such that light coupling is performed in a direction other than a direction horizontal with respect to said transparent base material,
    wherein light inputting/outputting between the optical device and an area outside of the integrated module is carried out due to the light permeability of the transparent base material,
    wherein the electric wiring connects the optical device and the input/output IC so as to transfer an electric signal between them, the electric wiring being positioned on a surface of the transparent base material opposite to the surface where the optical device is mounted, the electric wiring being provided as a ground electrode and serving as an electromagnetic shield for the optical device and the input/output IC,
    wherein the optical device comprises at least one of a light emitting device which converts an electrical current signal into an optical signal and outputs said optical signal, and a light receiving device which converts an optical signal into an electrical current signal,
    wherein the input/output IC comprises at least one of a driver IC that converts an electrical voltage signal into an electrical current signal and outputs the electrical current signal to the optical device and an amplifier IC which converts the electrical current signal from the light receiving device into an electrical voltage signal, and
    wherein light emitted from said optical device, said optical device being flip-chip mounted on a first surface of said transparent base material, passes through said transparent base material approximately perpendicular to the surface of said transparent base material and is emitted from said transparent base material approximately perpendicular to a second surface of said transparent base material, the second surface comprising a surface opposite the first surface.

2. The optoelectronic hybrid integrated module, as claimed in claim 1, wherein the transparent base material comprises a transparent plate transmitting a light and the transparent plate comprises a material having high permeability to a wavelength of the optical device.

3. The optoelectronic hybrid integrated module, as claimed in claim 1, wherein the transparent base material comprises a flexible sheet transmitting a light, and the flexible sheet comprises a material having high permeability to a wavelength of the optical device.

4. The optoelectronic hybrid integrated module, as claimed in claim 1, wherein the light coupling means is integrally formed with the transparent base material.

5. The optoelectronic hybrid integrated module, as claimed in claim 1, wherein the transparent base material includes an optical axis converter which converts a direction of an optical axis with reference to the light coupling means.

6. The optoelectronic hybrid integrated module, as claimed in claim 1, wherein the optical device and the input/output IC comprise an interposer which comprises a holder and a heat spreader.

7. The optoelectronic hybrid integrated module, as claimed in claim 1, wherein the transparent base material is fixed to a holding frame within which electric wiring is incorporated.

8. A light input/output apparatus comprising:
    an optoelectronic hybrid integrated module and a logic LSI, wherein the optoelectronic hybrid integrated module includes:
        an optical device for converting one of an optical signal into an electric signal and an electric signal into an optical signal;
        an input/output IC for drive-controlling the optical device; and a transparent base material having electric wiring and light permeability, the transparent base material including a light coupling means at a position substantially facing the optical device;

wherein the optical device and the input/output IC are flip-chip mounted on a surface of the transparent base material substantially aligned with the light coupling means, wherein light inputting/outputting between the optical device and an outside of the module is carried out due to the Light permeability of the transparent base material, wherein the logic LSI controls an electric signal input into or output from the optoelectronic hybrid integrated module, wherein the optoelectronic hybrid integrated module and the logic LSI are mounted on a same substrate, wherein the optical device comprises at least one of a light emitting device which converts an electrical current signal into an optical signal and outputs said optical signal, and a light receiving device which converts an optical signal into an electrical current signal, wherein the input/output IC comprises at least one of a driver IC which converts an electrical voltage signal into an electrical current signal and outputs the electrical current signal to the optical device and an amplifier IC which converts the electrical current signal from the light receiving device into an electrical voltage signal, and wherein light emitted from said optical device, said optical device being flip-chip mounted on a first surface of said transparent base material, passes through said transparent base material approximately perpendicular to the surface of said transparent base material and is emitted from said transparent base material approximately perpendicular to a second surface of said transparent base material, the second surface comprising a surface opposite the first surface.

9. The optoelectronic hybrid integrated circuit according to claim 1, wherein the optical device is sealed to the transparent base material devoid of an air gap.

10. The optoelectronic hybrid integrated circuit according to claim 1, wherein only the optical device is sealed to the transparent base material devoid of an air gap.

11. The optoelectronic hybrid integrated circuit according to claim 1, wherein the light coupling means comprises a convex lens formed on the transparent base material.

12. The optoelectronic hybrid integrated circuit according to claim 8, wherein the electric wiring connects the optical device and the input/output IC so as to transfer an electric signal between them, the electric wiring being positioned on a surface of the transparent base material opposite to the surface where the optical device is mounted.

13. The optoelectronic hybrid integrated circuit according to claim 8, wherein, the electric wiring is provided as a ground electrode and serves as an electromagnetic shield for the optical device and the input/output IC.

14. The optoelectronic hybrid integrated module, as claimed in claim 1, wherein the light coupling means improves light coupling efficiency.

* * * * *